(12) United States Patent
Tyner et al.

(10) Patent No.: US 6,377,051 B1
(45) Date of Patent: Apr. 23, 2002

(54) RELAY TEST SET USING COMPUTER CONTROLLED VOLTAGE SUPPLY TO STIMULATE BOTH VOLTAGE AND CURRENT TRANSFORMERS

(75) Inventors: Richard E. Tyner, Florence, SC (US); Gregory J. Grote, Jefferson City, MO (US)

(73) Assignee: ABB Power T&D Company Inc., Raleigh, NC (US)

( * ) Notice: Subject to any disclaimer, the term of this patent is extended or adjusted under 35 U.S.C. 154(b) by 0 days.

(21) Appl. No.: 09/454,907

(22) Filed: Dec. 3, 1999

(51) Int. Cl.[7] .............................................. G01R 31/327
(52) U.S. Cl. ...................................... 324/418; 324/415
(58) Field of Search ............................... 324/415, 416, 324/418, 771; 361/71, 152

(56) References Cited

U.S. PATENT DOCUMENTS

| | | | |
|---|---|---|---|
| 4,000,410 A | * 12/1976 | Hentschel et al. | ....... 324/771 X |
| 4,177,419 A | 12/1979 | Fiorentzis | ................... 324/418 |
| 4,464,628 A | 8/1984 | Nozawa | ...................... 324/418 |
| 4,689,570 A | * 8/1987 | Ohgaki et al. | ............... 324/418 |
| 4,727,318 A | * 2/1988 | Sakai et al. | .................. 324/765 |
| 4,803,434 A | 2/1989 | Walker | ....................... 324/424 |
| 5,101,153 A | * 3/1992 | Morong, III | ................. 324/537 |
| 5,479,315 A | * 12/1995 | Schweitzer, III | ........ 324/418 X |
| 5,576,625 A | 11/1996 | Sukegawa et al. | ........... 324/424 |
| 5,666,060 A | 9/1997 | Sukegawa et al. | ........... 324/617 |
| 5,742,513 A | 4/1998 | Bouhenguel et al. | ........ 364/492 |
| 5,786,699 A | 7/1998 | Sukegawa et al. | ........... 324/617 |
| 6,204,647 B1 | * 3/2001 | Niemann et al. | ....... 324/548 X |

* cited by examiner

Primary Examiner—Glenn W. Brown
(74) Attorney, Agent, or Firm—Woodcock Washburn LLP

(57) ABSTRACT

A relay test set of reduced size and weight includes a small, highly efficient voltage and current source. The test set incorporates a Class D switching amplifier design that greatly reduces the size of the power source needed to inject the correct voltage and current into the secondary inputs of a protective relay. To further reduce the size, weight and cost of the relay test set, a single voltage amplifier is used to drive both voltage and current secondary inputs of a protective relay. In so doing, this test set then becomes both a voltage transformer and current transformer simulator utilizing a single voltage power source at reduced size, weight and cost. To make the power source variable while maintaining accuracy, a microcomputer module is used to monitor both current and voltage being injected into the protective relay. This microcomputer may also automatically run the required relay tests and route the voltage or current to the appropriate inputs of the protective relay by direct control of a relay matrix.

6 Claims, 6 Drawing Sheets

RELAY TEST SET USING COMPUTER CONTROLLED VOLTAGE SUPPLY TO STIMULATE BOTH VOLTAGE AND CURRENT TRANSFORMERS

FIELD OF THE INVENTION

The present invention relates generally to the fields of protective relaying and test apparatus. More particularly, the invention relates, but is not limited to, a relay test set that utilizes a computer controlled voltage power supply to simulate secondary voltages and currents for testing a low voltage trip relay.

BACKGROUND OF THE INVENTION

A problem addressed by the present invention is that most relay test sets having the ability to inject a minimum of ten amps of alternating current at fifty volts are large and expensive. These large and expensive test sets also use separate supplies for the current and voltage. The present invention incorporates the ability to inject both high current and voltage into the secondary inputs of a protective relay using a single computer controlled voltage power supply. By using this design, the relay test set is made to be both cost effective and portable. The secondary inputs of protective relays are used to connect the metering current and voltage transformers. By injecting the voltage and current into these inputs, the test set becomes a simulator of both current and voltage transformers.

To reduce both size and cost, such a test set requires a very efficient power supply that does not dissipate large amounts of heat. A unique aspect of the present invention is the use of a microcomputer module to control a variable voltage Class D power supply to vary both voltage and current as needed for the required test. The microcomputer also monitors the voltage and current being injected into the unit under test, UUT, to insure the proper levels are attained.

SUMMARY OF THE INVENTION

The present invention accomplishes several tasks in the area of protective relay testing. Typical relay test sets are large, heavy and costly. To reduce the size and weight of the test set, a small, highly efficient voltage and current source has been designed. Linear power supplies are very inefficient and require large heat sinks to dissipate heat. A presently preferred implementation of this invention incorporates a Class D switching amplifier design that greatly reduces the size of the power source needed to inject the correct voltage and current into the secondary inputs of a protective relay. To further reduce the size, weight and cost of the relay test set, one may also use a single voltage amplifier to drive both voltage and current secondary inputs of a protective relay, rather than using a separate voltage and current source. In so doing, this test set then becomes both a voltage transformer and current transformer simulator utilizing a single voltage power source at reduced size, weight and cost.

It is desirable for the power source to be variable while maintaining accuracy. To accomplish these goals, a microcomputer module may be incorporated to monitor both current and voltage being injected into a protective relay. This microcomputer may also automatically run the required relay tests and route the voltage or current to the appropriate inputs of the protective relay by direct control of a relay matrix.

Other features of the present invention are disclosed below.

DETAILED DESCRIPTION OF PREFERRED EMBODIMENTS

Figure 1:
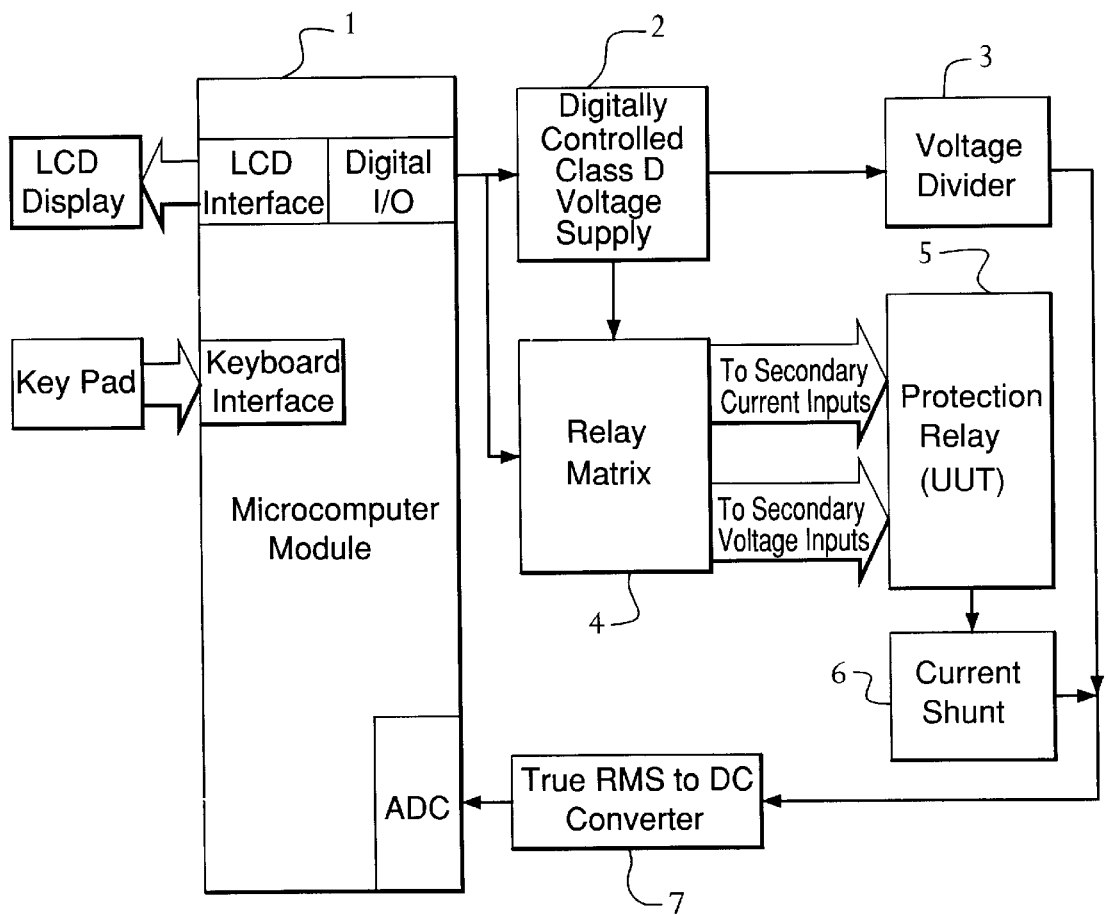
FIG. 1 is a block diagram of a relay test set in accordance with the present invention.
Figure 5:
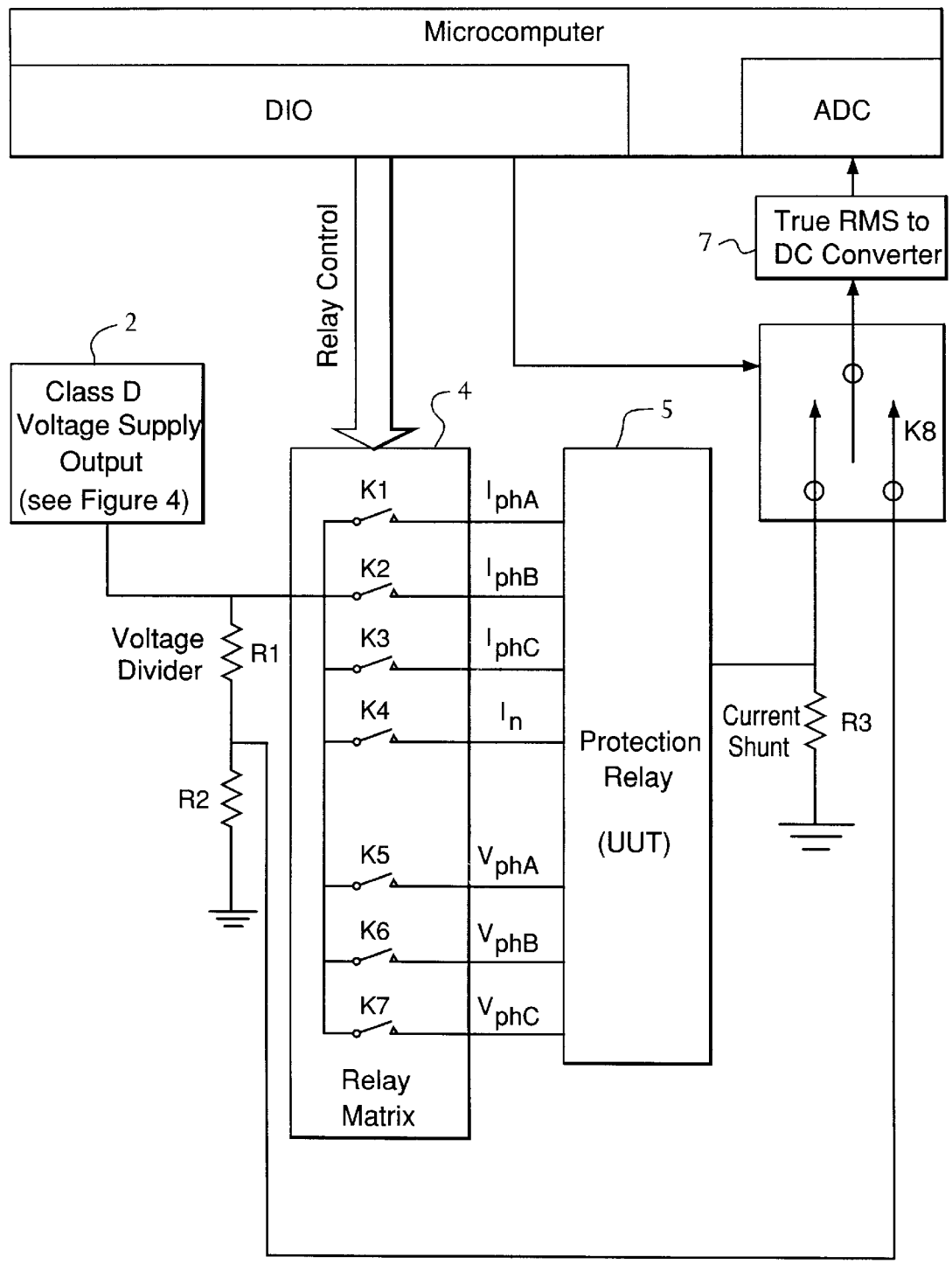
FIG. 5 is a diagram showing the computer controlled routing circuit via a relay matrix and the voltage and current sensor circuit.

The presently preferred embodiment depicted in FIG. 1 includes a microcomputer module 1 with digital inputs and outputs (digital I/O), LCD and keyboard interface and an analog to digital converter (ADC), as shown. The microcomputer 1 controls the output of a Class D Voltage Supply 2. The voltage output of the Class D voltage supply is monitored by using a voltage divider 3 to reduce its signal level to a point at which it can be handled by a "True RMS to DC Converter" 7 and is then input into the microcomputer's ADC circuit. The output of the Class D voltage supply 2 is also connected to a relay matrix circuit 4. This enables the microcomputer to route the proper signal to the secondary inputs of a unit under test (UUT) 5. In the case of current injection into the UUT, the current is routed from the Class D voltage supply 2, through the relay matrix 4 and into the UUT 5 and returns through a current shunt 6 to the ground of the supply (the grounding of the current shunt is depicted in FIG. 5—see R3). As with the voltage divider, the current shunt 6 outputs a low level voltage, but proportional to the current, into the True RMS to DC Converter 7 and into the microcomputer module's ADC.

Figure 2:
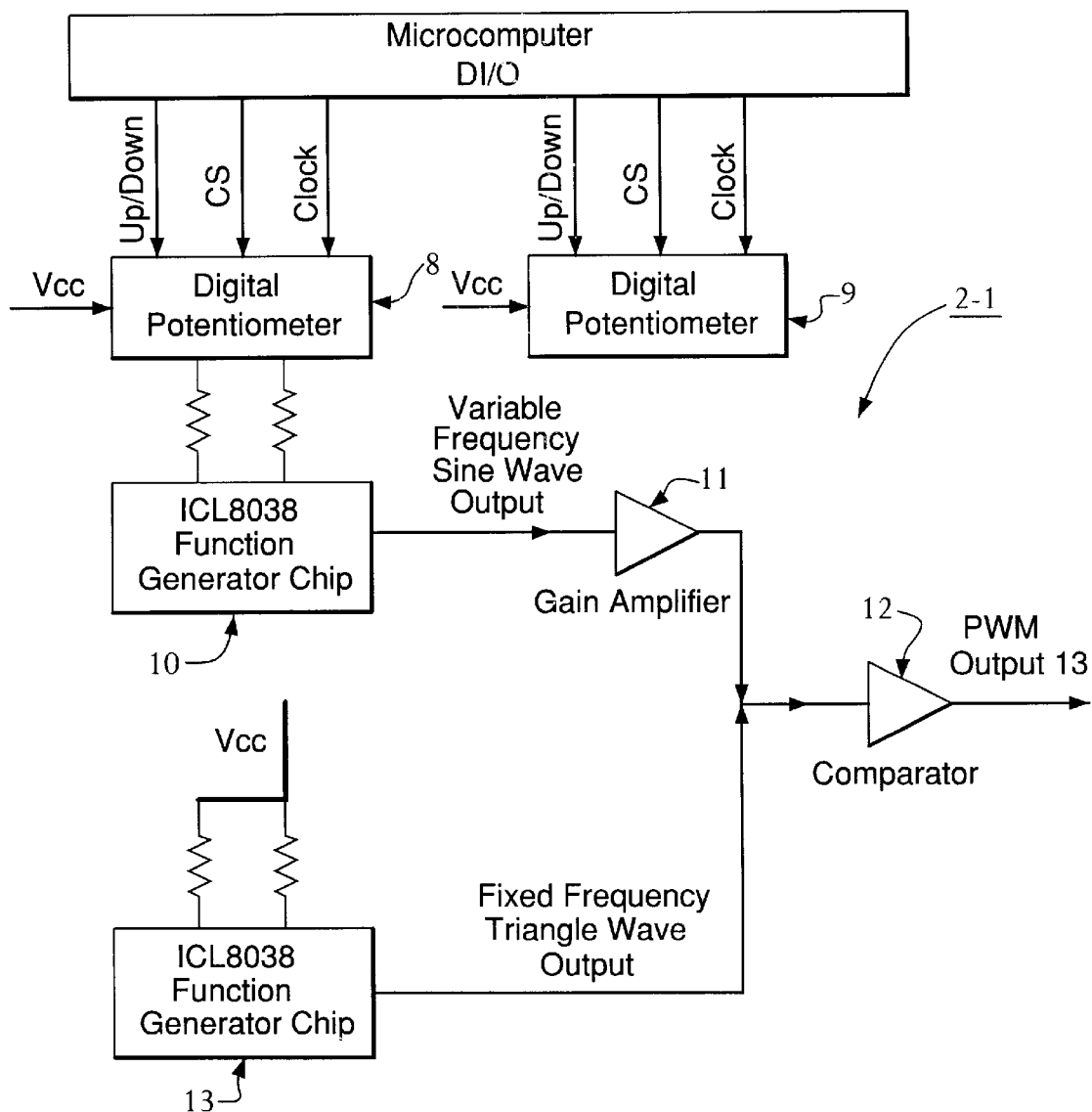
FIG. 2 is a diagram of a computer control pulse width modulator portion of the Class D amplifier in accordance with the present invention.
Figure 3:
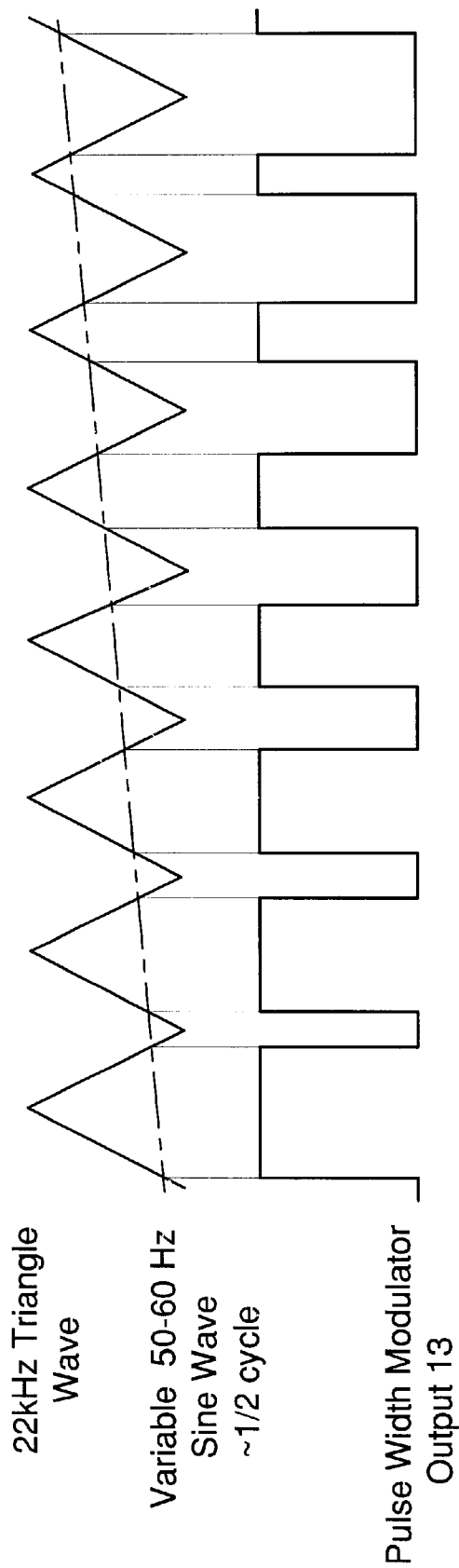
FIG. 3 is a diagram of the waveforms of the pulse width modulator circuitry.

FIG. 2 shows more detail of a pulse width modulator (PWM) circuit 2-1 of the Digitally Controlled Class D Voltage Supply 2. The PWM design incorporates digital potentiometers 8 and 9, and two precision function generator IC chips 10 and 13. A triangle wave output at a fixed frequency of 22 kHz is achieved from the function generator chip 13. The function generator chip 10 is a variable frequency sine wave generator controlled by the microcomputer 1 through the use of digital potentiometer 8. The digital potentiometers 8 and 9 are controlled via three control signals, "Up/Down," "Clock" and "Chip Select" (CS). Via the microcomputer's Digital I/O, the digital potentiometer is selected by the chip select line. Then the direction is chosen by the Up/Down input. The Clock signal is finally used to move the digital potentiometer to its desired position. By using this type of digital control, the microcomputer can set the frequency of the injected signal to the UUT 5 (FIG. 1). Likewise, by use of the digital potentiometer 9, the amplitude of the injected signals can also be computer controlled. The digital potentiometer 9 is inserted into the feedback circuit of the operational amplifier 11 to control the gain of the sine wave signal generated by the function generator chip 10. The output of the gain amplifier 11 and the function generator 13 is then input into an operational amplifier configured as an infinite gain comparator 12. The result is a pulse width modulation output 13 as shown in FIG. 3 (Note that FIG. 3 shows approximately ½ of the sine wave cycle as an example of the PWM output.)

Figure 4:
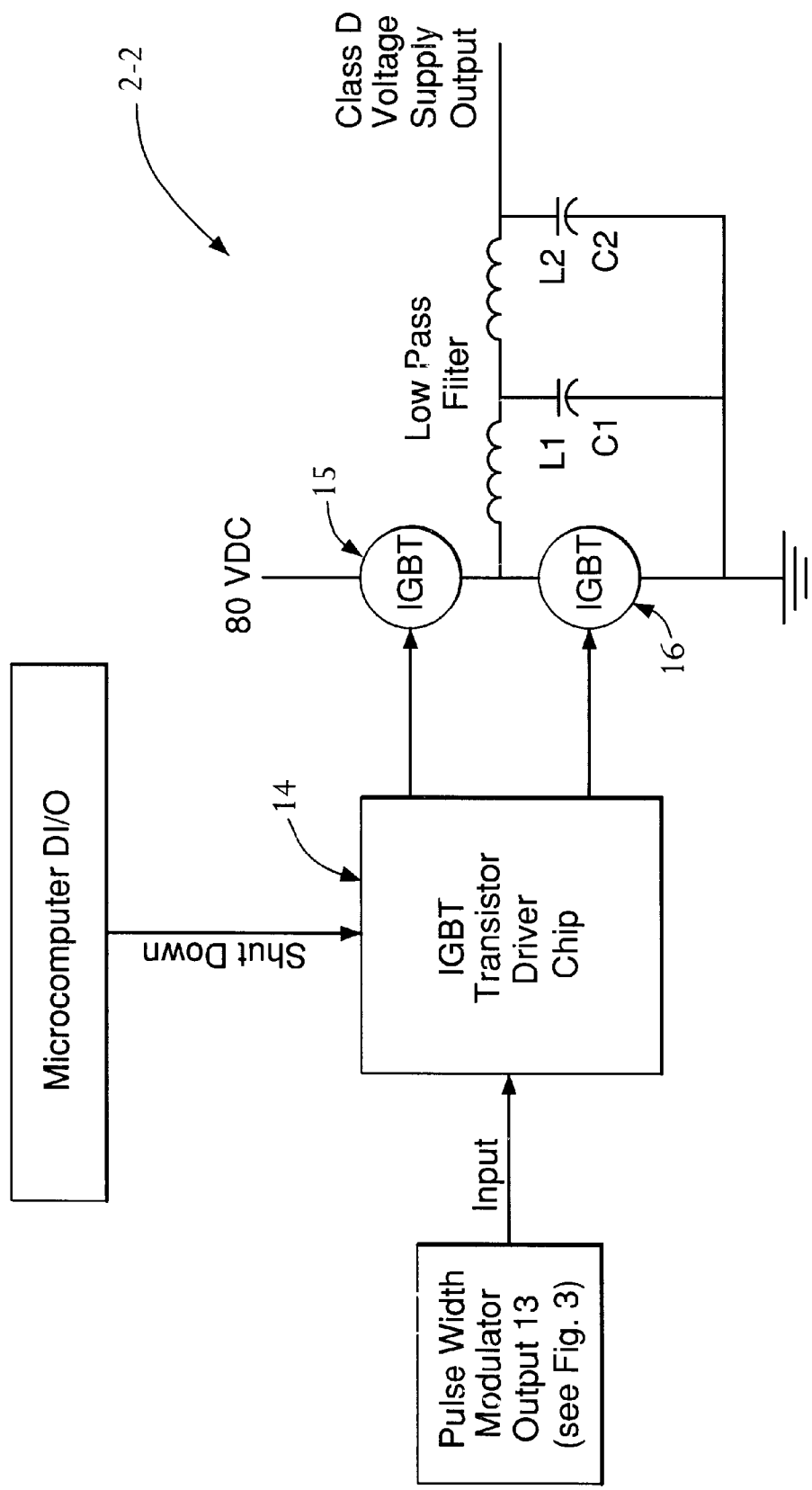
FIG. 4 is a diagram of the driver circuit, output transistors and low pass filter of the Class D amplifier utilizing computer shut down of the amplifier.

The pulse width modulator output 13 is now controlled and amplified by additional circuitry 2-2 as shown in FIG. 4. The pulse width modulation 13 is input into an IGBT transistor driver IC chip 14 with high and low transistor drive outputs. The microcomputer can turn on and off the amplifier by use of the shut down input of the driver chip. The high and low outputs of the driver chip are inverted so that only one IGBT transistor, 15 or 16, is on at any time. As the pulse width modulator input goes high, IGBT 15 is turned on and IGBT 16 is turned off. This pulls the output of the series connected IGBTs to 80 VDC and isolates the output from ground. Likewise, as the pulse width modulator goes low, IGBT 16 is turned on and IGBT 15 is turned off. This pulls the output to ground and isolates the 80VDC. This has now amplified the pulse width modulation from approximately 0 to 12 VDC output to a signal that switches from 0 to 80 VDC. The amplified pulse width maintains its switching frequency of 22 kHz while being modulated at the variable 50 to 60 Hz. The high frequency is now to be filtered out of the desired injection signal and this is achieved using a low pass filter. This filter, made up of L1, L2, C1 and C2, is a 12 dB / octave low pass filter and removes the high frequency component to better than −75 dB. The result is the frequency and amplitude controlled alternating current signal.

FIG. 5 shows the configuration of the relay matrix 4 for connection of the UUT and the monitored voltage and current feedback signals to the microcomputer ADC circuit. The output of the Class D voltage supply 2 is connected to the inputs of relays K1 through K7. The normally open contact of relays K1, 2, 3 and 4 are connected to the UUT current inputs, phase A, B, C, and neutral, respectively. The normally open contact of relays K5, 6, and 7 are connected to the UUT voltage inputs, phase A, B, and C, respectively. This relay matrix allows the microcomputer to control where the single-phase voltage supply is injected to the UUT. The voltage divider circuit, R1 and R2, reduces the output voltage to a lower level as needed at the input of the true RMS to DC converter 7. The output of the current shunt, R3, is also a low level voltage signal proportional to the current as needed by the true RMS to DC converter. Both of these signals are fed through a single pole, double throw relay, K8. This allows the computer to monitor the desired signal, voltage or current. This completes a closed loop feedback system. The microcomputer can now set the desired frequency and amplitude of a voltage or current injected signal, monitor the voltage and current, and correct the signal to the proper level through the feedback circuit.

Figure 6:
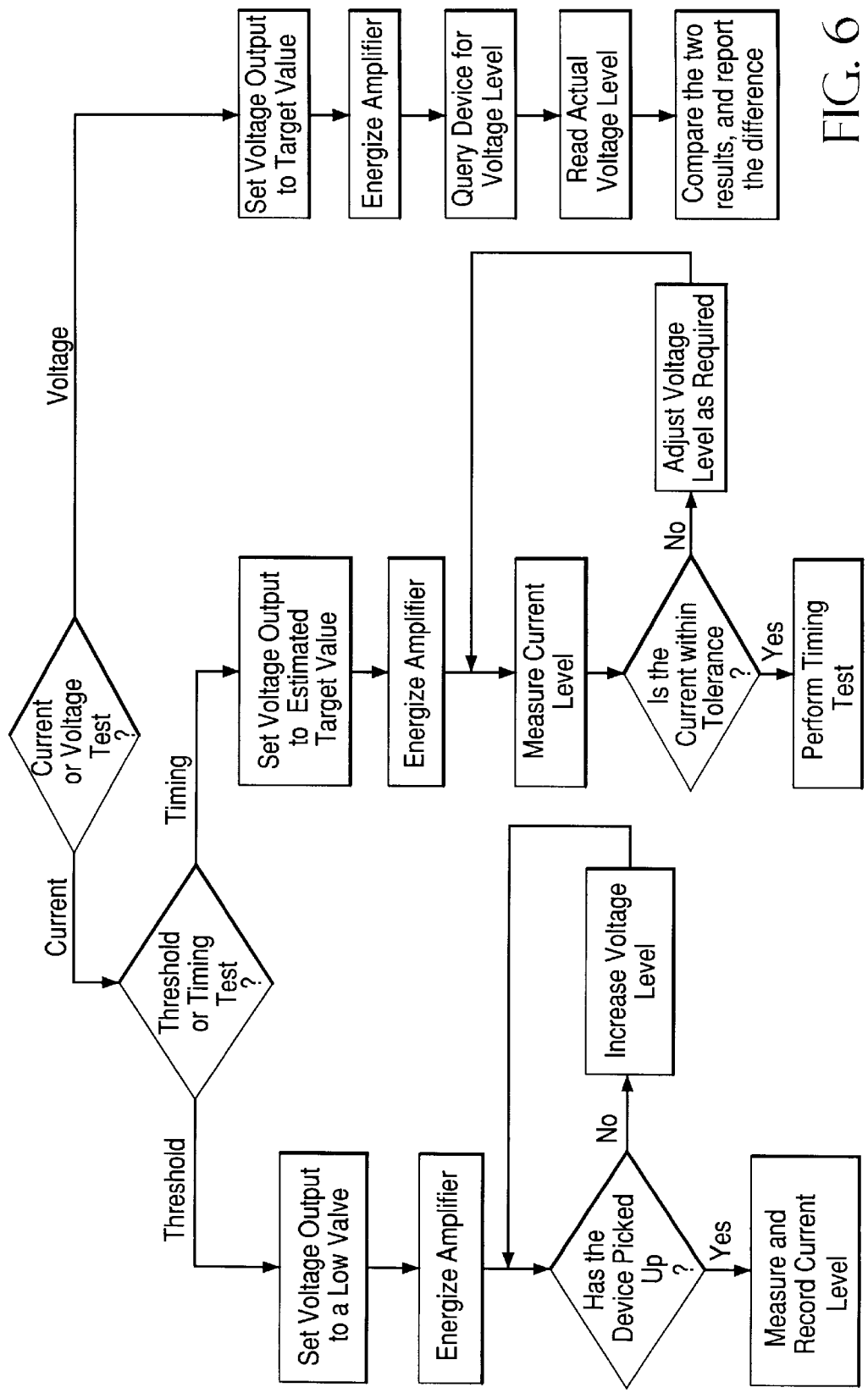
FIG. 6 is a flowchart of test set software logic in accordance with the present invention.

FIG. 6 depicts the software logic for the relay test system. As shown, the logic begins by deciding whether a current or voltage test is to be conducted. If a current test is to be conducted, the logic continues along the path shown on the left hand side of FIG. 6. On the other hand, if a voltage test is to be conducted, the logic continues along the path shown on the right hand side of FIG. 6.

If a current test is to be conducted, the logic decides whether a threshold or timing delay test is to be conducted. If a threshold test is to be conducted, the logic takes the left-most branch of the flowchart. If a timing delay test is to be conducted, the logic takes the center branch of the flowchart.

In the left-most branch (threshold test), the logic first sets the voltage output to a low value. Next, the amplifier is energized. Next, the logic decides whether the device has "picked up." If not, the voltage level is increased and the logic again tests whether the device has picked up. Once the device has picked up, the current level is measured and recorded.

Referring to the center branch of the flowchart, for the timing test, the logic first sets the voltage output to an estimated target value. Next, the amplifier is energized, and then the current level is measured. The logic next determines whether the current is within tolerance. If not, the voltage level is adjusted as necessary, and the current level is again measured as indicated. Once the current is within tolerance, the timing test is performed.

Referring to the right-most branch of the flowchart, for the voltage test, the logic first sets the voltage output to a target level. The amplifier is energized, and then the device is queried for its voltage level. Next, the actual voltage level is read, and the two results (the voltage level as determined from the query and the actual voltage level) are compared and any difference is reported.

The present invention is not limited to the particulars of the presently preferred embodiment disclosed above. Those skilled in the art will recognize that many variations and modifications of the invention can be made within the true scope of the present invention.

We claim:

1. A test set for driving inputs of a unit under test (UUT), wherein the UUT comprises a low voltage protective relay, comprising a voltage and current source that includes a single voltage amplifier to drive both voltage and current inputs of the protective relay; a microcomputer for monitoring both current and voltage being injected into the protective relay; and a relay matrix operatively coupled to the microcomputer and the protective relay, wherein the microcomputer routes the voltage or current to the appropriate inputs of the protective relay by direct control of the relay matrix.

2. A test set as recited in claim 1, wherein the microcomputer automatically runs required tests.

3. A test set as recited in claim 2, wherein the voltage and current source includes a Class D switching amplifier that is part of the single voltage amplifier.

4. A test set as recited in claim 1, wherein the voltage and current source includes a Class D switching amplifier that is part of the single voltage amplifier.

5. A test set as recited in claim 4, wherein the Class D switching amplifier comprises circuitry that includes a pair of digital potentiometers controlled by the microcomputer; a first function generator that outputs a variable frequency sine wave; a second function generator that outputs a fixed frequency triangle wave; and means for generating a PWM output based on the sine and triangle wave outputs of the first and second function generators, wherein a first one of the pair of digital potentiometers is used by the microcomputer to control the frequency of the PWM output and a second one of the pair of digital potentiometers is used by the microcomputer to control the amplitude of the PWM output.

6. A test set as recited in claim 5, wherein the Class D switching amplifier further comprises means for converting the PWM output into a Class D voltage supply output for injection into the UUT.

\* \* \* \* \*